United States Patent
Boegl et al.

(10) Patent No.: US 6,999,524 B1
(45) Date of Patent: Feb. 14, 2006

(54) ARRANGEMENT FOR CONTROLLING THE OUTPUT POWER OF AN HF TRANSMITTER

(75) Inventors: Thomas Boegl, Augsburg (DE);
Reinhard Ritschel, Waldkraiburg (DE);
Thomas Valten, Unterhaching (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 301 days.

(21) Appl. No.: 10/149,075

(22) PCT Filed: Nov. 9, 2000

(86) PCT No.: PCT/EP00/11095

§ 371 (c)(1),
(2), (4) Date: Sep. 24, 2002

(87) PCT Pub. No.: WO01/43281

PCT Pub. Date: Jun. 14, 2001

(30) Foreign Application Priority Data

Dec. 9, 1999 (DE) .................................. 199 59 403

(51) Int. Cl.
*H04L 25/03* (2006.01)
*H04B 1/04* (2006.01)
(52) U.S. Cl. ...................................... 375/297; 455/126
(58) Field of Classification Search ................ 375/297, 375/295, 261; 332/103, 117, 159, 149; 330/149, 330/86; 455/126, 83, 296; 333/125; 342/165, 342/173

See application file for complete search history.

(56) References Cited

U.S. PATENT DOCUMENTS

| | | | |
|---|---|---|---|
| 4,933,986 A | 6/1990 | Leitch | |
| 5,066,923 A | 11/1991 | Gailus et al. | |
| 5,945,876 A * | 8/1999 | Jones | 330/51 |
| 6,058,291 A * | 5/2000 | Ketcham | 455/46 |
| 6,188,732 B1 * | 2/2001 | Rha | 375/297 |
| 6,233,438 B1 * | 5/2001 | Wynn | 455/126 |
| 6,246,286 B1 * | 6/2001 | Persson | 330/149 |
| 6,693,969 B1 * | 2/2004 | Montalvo et al. | 375/259 |
| 6,741,643 B1 * | 5/2004 | McGibney | 375/229 |
| 6,798,844 B2 * | 9/2004 | Ratto | 375/296 |

FOREIGN PATENT DOCUMENTS

| | | |
|---|---|---|
| DE | 2057 633 | 5/1972 |
| EP | 0 565 507 A3 | 4/1993 |
| EP | 0 612 144 A1 | 2/1994 |
| GB | 2 301 247 A | 11/1996 |

* cited by examiner

*Primary Examiner*—Khai Tran
(74) *Attorney, Agent, or Firm*—Lewis, Rice & Fingersh, L.C.

(57) ABSTRACT

The invention relates to an arrangement for controlling the output power of a high-frequency transmitter. The control power of the transmitter output stage is controlled according to a correcting variable (R) and by means of an actuator, whereby said variable is obtained by comparing the output power to a desired value (S). An I./Q modulator (M) is used as actuator.

7 Claims, 1 Drawing Sheet

ARRANGEMENT FOR CONTROLLING THE OUTPUT POWER OF AN HF TRANSMITTER

Figure 1:
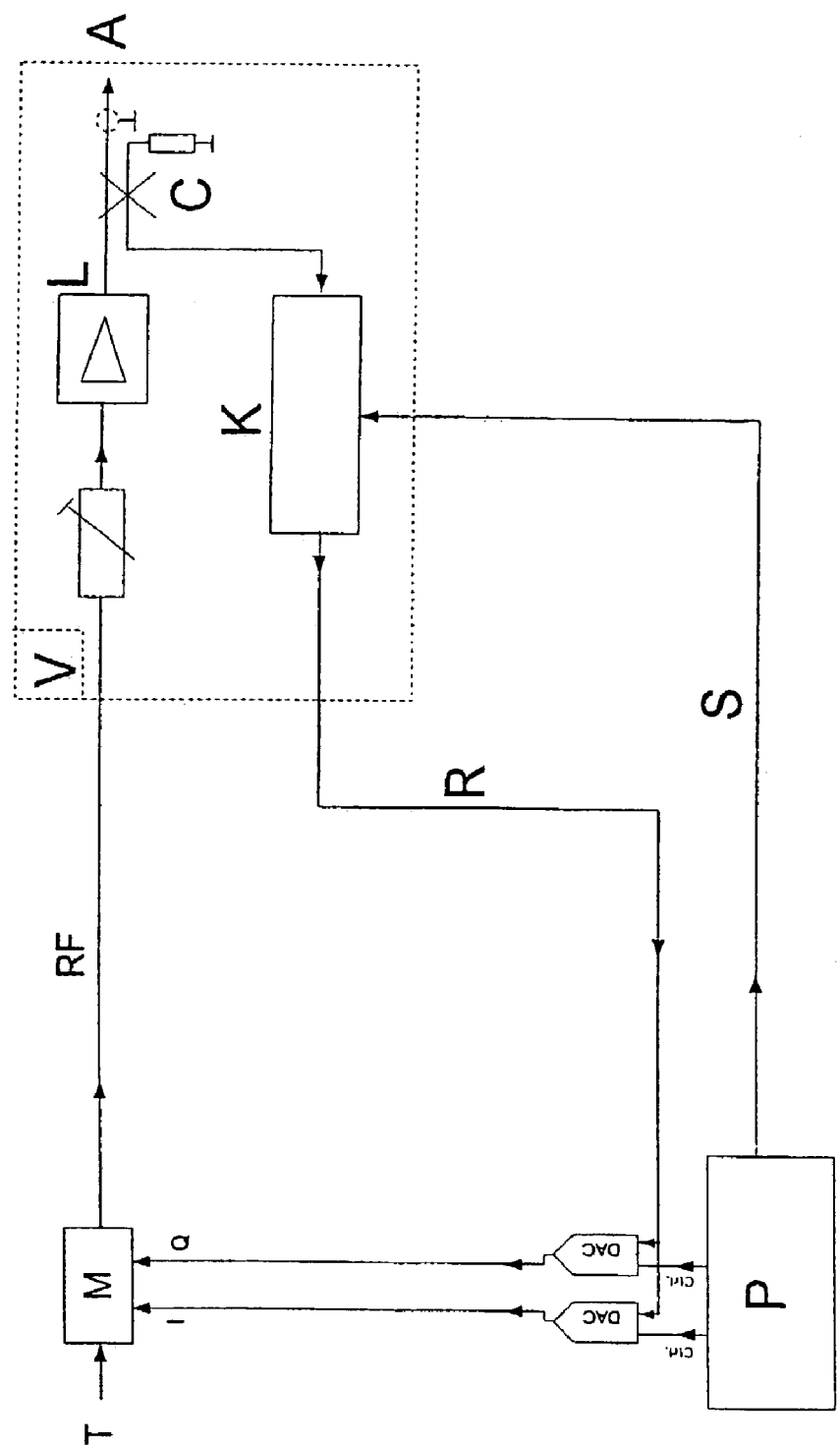

The invention relates to an arrangement for controlling the output power of an HF transmitter as detailed in the preamble to the main claim.

Control arrangements of this kind are known. They are used to control the output power to which a transmitter is set, which can be affected by many factors, to a constant value. To do this, the output power is measured and compared with a preset desired value. A control circuit corrects any changes from the desired value by controlling a variable final controlling element in the processing chain of the transmitter as appropriate in order to set gain and thus output power. In the known arrangements this final controlling element is for example a controllable amplifier or a variable attenuator. With a controllable amplifier the operating point does not remain constant and variable attenuators are disadvantageous from the point of view of efficiency.

It is therefore an object of the invention to provide a control arrangement of this kind for high-frequency transmitters that avoids these disadvantages and as far as possible uses for this purpose subassemblies of the transmitter that already exist.

This object is achieved by an arrangement as detailed in the preamble to the main claim by virtue of the characterizing features of the claim. Advantageous refinements can be seen from the subclaims.

In accordance with the invention, what is used as a final controlling element is a normal I/Q modulator or quadrature mixer whose output amplitude is controlled as appropriate in a known manner, which is equivalent to varying the controlled power. The I/Q modulator may be an analog or digital one in this case. It is particularly advantageous to use for this purpose the I/Q modulator that is present in many HF transmitters to generate the complex modulation. This makes it unnecessary to have a separate final controlling element for controlling power. An arrangement according to the invention also has the advantage of a constant operating point for the entire amplifier chain because no shift in operating point such as occurs in controllable amplifiers is required to perform the control. The arrangement according to the invention is suitable for any kind of I/Q modulation that is transmitted via the transmitter.

The invention will be explained in detail below by reference to a schematic drawing and an embodiment.

The FIGURE shows a block circuit diagram of a high-frequency transmitter in which complex modulation of a high-frequency carrier T is performed by means of an analog I/Q modulator M. The modulated high-frequency signal RF is amplified to the desired transmitter power in a downstream power amplifier V and is radiated from the antenna A. The two complex baseband components I and Q that are modulated onto the carrier T are generated in a digital signal processor P and are fed to the I/Q modulator M as analog signals via two digital/analog converters DA1 and DA2. In signal processor P, there is also generated an output signal S that corresponds to the instantaneous desired power of the transmitter and that is fed as a desired-value signal to a comparator K in which it is compared with the output power from the power output stage V, this output power being coupled out at the output of power amplifier L by means of a directional coupler C. In comparator K, a control signal R is generated by comparing the desired and actual values and is fed to the two D/A converters DA1 and DA2. The amplitude of the base-signal components I and Q is thus multiplied by the control signal R, or in other words the amplitude of the I and Q components is altered as appropriate and hence the controlled power of the RF signal at the output of modulator M is altered too in a similar manner. In the embodiment shown, the multiplication is performed by varying the reference voltage of D/A converters DA1 and DA2. This arrangement has the advantage that signal processor P is not tied directly into the control circuit and there is thus a saving on computing power.

If a desired value in the form of the instantaneous power S from signal processor P is not available, a simple DC voltage can be used as a desired value in comparator K. If this is the case, provision is then made for mean-value control. It would also be possible, by A/D conversion of control signal R, to generate a corresponding digital signal which would then be processed directly in signal processor P to enable the controlled power at the output of the modulator to be varied accordingly.

The control arrangement according to the invention having an I/Q modulator as a final controlling element may even be used if no additional modulation is performed by the I/Q modulator M, i.e. if the incoming controlled power is already modulated and the I/Q modulator is used as a quadrature mixer. When this is the case, an I/Q modulated intermediate-frequency carrier is for example generated directly in digital signal processor P by means of a suitable algorithm and is then once again mixed, via the I and Q inputs of modulator M, with the unmodulated carrier T to give the desired high-frequency output signal RF. In this case the control of the amplitude at the output of the modulator or mixer M is performed by purely digital means by taking account of the correcting variable R in the algorithm of processor P when generating the modulated intermediate-frequency signal.

The invention claimed is:

1. An arrangement for controlling the output power of a high-frequency transmitter comprising:
   a digital signal processor (P) generating baseband components (I and Q) for modulation onto a high-frequency carrier (T), said digital signal processor (P) also generating an output signal (S) corresponding to an instantaneous desired output power of said high-frequency transmitter;
   a comparator (K) for generating a control signal (R) by comparing the output power of a power amplifier (L) with said output signal (S); and
   an I/Q modulator (M) for controlling input power to said power amplifier (L);
   wherein output power of said I/Q modulator (M) is dependent on said control signal (R);
   wherein input power to said power amplifier comprises said output power of said I/Q modulator (M); and
   wherein output power of said high frequency transmitter is dependent on said control signal (R).

2. The arrangement of claim 1 wherein:
   said I/Q modulator (M) is used as a quadrature mixer.

3. The arrangement of claim 1 wherein:
   said I/Q modulator (M) is used for modulating baseband components (I and Q) onto a carrier (T).

4. The arrangement of claim 3 wherein:
   said baseband components (I and Q) are altered dependent on said control signal (R) prior to being modulated onto said carrier (T) by said I/Q modulator (M).

5. The arrangement of claim 1 wherein:
   said I/Q modulator (M) changes an amplitude of an already modulated signal based on said control signal (R) to control said input power to said power amplifier.

6. The arrangement of claim 1 wherein:
said desired output power value (S) comprises a simple DC voltage.

7. An arrangement for controlling the output power of a high-frequency transmitter comprising:
- a digital signal processor (P) generating baseband components (I and Q) for modulation onto a high-frequency carrier (T), said digital signal processor (P) also generating an output signal (S) corresponding to an instantaneous desired output power of said high-frequency transmitter;
- a comparator (K) for generating a control signal (R) by comparing the output power of a power amplifier (L) with said output signal (S);
- an I/Q modulator (M) for controlling input power to said power amplifier (L); and
- digital to analog converters for providing said baseband components to said IQ modulator;
- wherein said control signal (R) if provided by said comparator (K) directly to said digital to analog converters.

* * * * *